United States Patent [19]

De Luca et al.

[11] Patent Number: 4,832,192

[45] Date of Patent: May 23, 1989

[54] MAINTENANCE TERMINATION UNIT CIRCUIT STRUCTURE

[75] Inventors: Paul V. De Luca, Plandome Manor; Peter Hung, Wheatley Heights, both of N.Y.

[73] Assignee: Ponta Systems Corp., Syosset, N.Y.

[21] Appl. No.: 859,302

[22] Filed: May 5, 1986

[51] Int. Cl.$^4$ ............................................. B65D 73/02
[52] U.S. Cl. ................................. 206/334; 206/449; 361/394; 361/400
[58] Field of Search .............. 206/334, 449, 455, 456, 206/0.82, 0.83, 0.84; 361/394, 399, 400, 415, 417; 250/23.83, 23.86

[56] References Cited

U.S. PATENT DOCUMENTS

| | | | |
|---|---|---|---|
| 3,473,648 | 10/1969 | Paluzzi | 206/0.82 |
| 3,792,771 | 2/1974 | Bonjean | 206/455 |
| 4,385,688 | 5/1983 | Grant | 206/0.82 |
| 4,425,997 | 7/1984 | Grant | 206/0.82 |
| 4,478,331 | 10/1984 | Ruin | 206/334 |

FOREIGN PATENT DOCUMENTS

| | | | |
|---|---|---|---|
| 633861 | 1/1962 | Canada | 206/455 |
| 2144804 | 3/1973 | Fed. Rep. of Germany | 206/455 |

*Primary Examiner*—Joseph Man-Fu Moy
*Attorney, Agent, or Firm*—Charles E. Temko

[57] ABSTRACT

A self contained circuit board and housing therefore adapted to be positioned within a telephone network interface housing in which provision is made for variance in the dimensions of a pair of retaining slots in the interface housing of different manufacture. The circuit board housing includes a pair of oppositely disposed side walls, each having a laterally extending flange include a resilient component which flexed to accommodate for differences in clearances between the retaining slots.

1 Claim, 1 Drawing Sheet

U.S. Patent  May 23, 1989  4,832,192
FIG. 1.
(PRIOR ART)
FIG. 2.
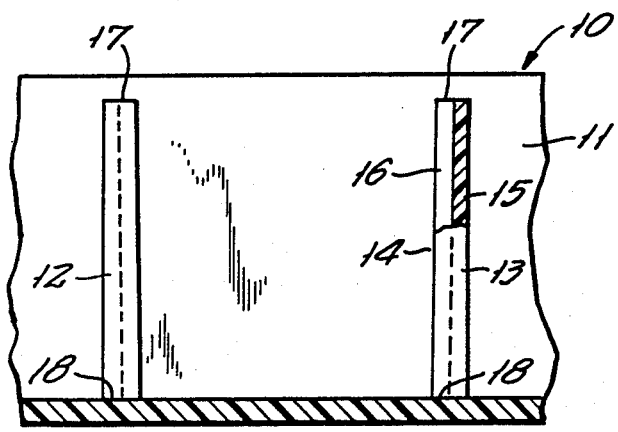
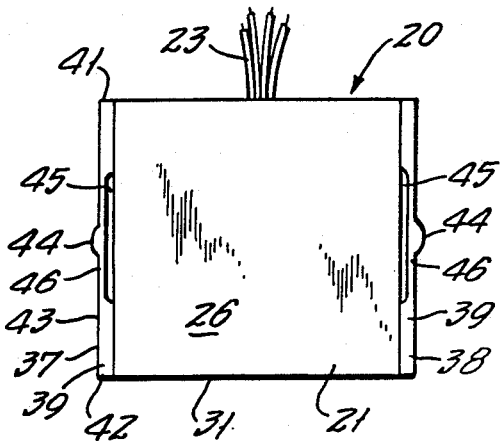
FIG. 3.
FIG. 4.
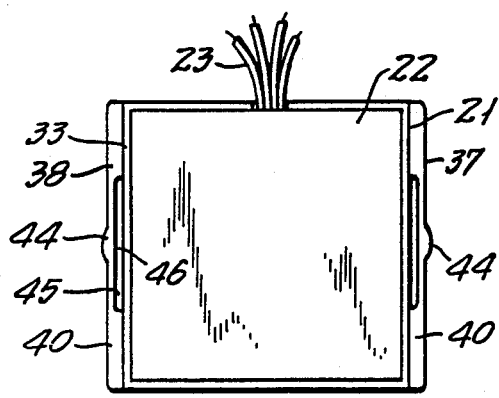
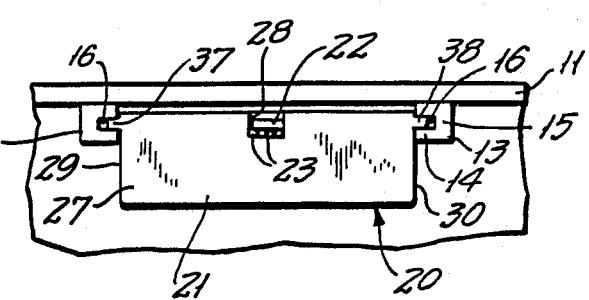

4,832,192

MAINTENANCE TERMINATION UNIT CIRCUIT STRUCTURE

BACKGROUND OF THE INVENTION

This invention relates generally to the field of telephony, and more particularly to an improved self-contained circuit element adapted to be used in conjunction with a telephone network interface device of a type normally installed at the premises of a subscriber. Circuit elements of this type are used, for example, to open the subscriber line at the subscriber premises for purposes of testing the telephone company portion of the line for the existence of faults independently of testing subscriber owned equipment.

In many of such interface devices, the interface housing is provided with an inner wall, one surface of which includes a pair of opposed slot-forming members which support the circuit element against the inner wall in such manner that projecting leads of the circuit board may be readily interconnected to adjacent screw terminals. While the slot forming means in interface housings of any given manufacturer are normally within close commercial tolerances, where the circuit board housing is to be installed in interface housing of different manufacture, the range of clearance which must be accommodated is excessive, in some cases to a degree that precludes engagement of the circuit board housing without damage.

SUMMARY OF THE INVENTION

Briefly stated, the invention contemplates the provision of an improved circuit board housing construction of the class described in which the mounting means thereon includes resilient components which are self-adjusting upon engagement with the inner wall of the interface housing to prevent ready engagement without damage over a wide range of clearances in the corresponding slot structures.

BRIEF DESCRIPTION OF THE DRAWINGS

In the drawings, to which reference will be made in the specification, similar reference characters have been employed to designate corresponding parts throughout the several views.

FIG. 1 is a fragmentary view in elevation showing an inner wall of a telephone network interface housing of known type with which the described embodiment of the invention is used.

FIG. 2 is a view in elevation of an embodiment of the invention in detached condition.

FIG. 3 is a view in elevation thereof showing the side opposite that seen in FIG. 1.

FIG. 4 is a fragmentary top plan view showing the structure of FIG. 2 in engagement with the structure of FIG. 1.

DETAILED DESCRIPTION OF THE DISCLOSED EMBODIMENT

In accordance with the invention, and with reference to FIG. 1, reference character 10 designates an inner wall of a known telephone interface housing, a surface 11 thereof of which is provided with first and second opposed slot forming flanges 12 and 13. Each of the flanges includes a laterally extending portion 14 and a transverse portion 15 which cooperates to form a groove 16 having an open end 17 and a closed end 18.

The embodiment, generally indicated by reference character 20 includes a housing element 21 and a circuit board element 22 resiliently maintained therein. The circuit board element is of known type, the details of which form no part of the present disclosure. A plurality of leads 23 extend outwardly from one edge of the board element 22 for convenient interconnection to screw terminals (not shown) disposed within the interface housing.

The housing element 21 is most conveniently formed as a synthetic resinous injection moulding and includes an outer planar wall 26 and an upper wall 27 having a rectangular opening 28 to accommodate the leads 23, a pair of oppositely disposed side walls 29 and 30, and a lower wall 31. The members 26-30 form a rectangularly shaped recess to support the board element 22, this recess being bordered by a continuous peripheral edge surface 33 which abuts the surface 11 when the device is in installed condition.

Extending laterally outwardly from the side walls 29 and 30 are first and second elongated flanges 37 and 38, each bounded by first and second planar surfaces 39 and 40, end edge surfaces 41 and 42, and an outer edge surface 43. Extending further outwardly from the surfaces 42 and 43 are rounded projections 44. Medially positioned within each of the flanges 38 and 39 is an elongated through slot 45, the presence of which forms resilient segments 46 immediately behind the projections 44.

Referring to FIG. 4, upon the insertion of the device 20 within the opposed grooves 16, depending upon the effective distance between the grooves, the projections 44 will be subject to greater or lesser pressure within a respective slot. This pressure is accommodated by a slight flexing of the resilient segments 46 which permits the projections 44 to move toward each other while generating a corresponding reactive force against the respective slot forming means. In this manner, substantial differences in effective distance between slot forming members in housings of different manufacture is relatively accommodated without sacrificing effective purchase of housing element 21 with the interface housing 10.

We wish it to be understood that we do not consider the invention to be limited to the precise details of structure shown and set forth in this specification, for obvious modification will occur to those skilled in the art to which the invention pertains.

We claim:

1. A circuit board housing for use in enclosing a circuit board, said housing being adapted to be slidably engaged into slot forming means on a supporting wall in which the effective width of a pair of opposed slots formed by said slot forming means vary beyond normal commercial tolerances, said housing comprising: an outer planar wall and a pair of opposed side walls communicating with said outer planar wall; said side walls each defining a free edge bordering an opening for insertion of a circuit board; each of said side walls having a laterally extending flange at said free edge for engaging said slot forming means; said last mentioned flanges each having an effective thickness corresponding to the width of an engaged slot, and outer edge surfaces spaced from each other a distance corresponding to the spacing of said slot forming members; a projection disposed on each of said outer edge surfaces of thickness corresponding to that of said last mentioned flanges, said flanges having an elongated opening extending through the plane thereof to form a resilient segment of material supporting said projections whereby to permit limited flexing of said projection within the plane of said flange; whereby upon engagement of said circuit board housing within said slot forming means, said projections may flex within the plane of a respective laterally extending flange to apply a resilient force against said slot forming means to assure frictional engagement therewith.

* * * * *